(12) United States Patent
Miller et al.

(10) Patent No.: US 8,187,416 B2
(45) Date of Patent: May 29, 2012

(54) INTERIOR ANTENNA FOR SUBSTRATE PROCESSING CHAMBER

(75) Inventors: Keith A. Miller, Sunnyvale, CA (US); Genhua Xu, Shanghai (CN); Shengde Zhong, Shanghai (CN); Mahendra Bhagwat Lokhande, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 933 days.

(21) Appl. No.: 11/134,033

(22) Filed: May 20, 2005

(65) Prior Publication Data

US 2006/0260937 A1    Nov. 23, 2006

(51) Int. Cl.
*C23C 16/00* (2006.01)
*H01L 21/306* (2006.01)

(52) U.S. Cl. ................ 156/345.48; 118/723 I
(58) Field of Classification Search ............. 118/723 I, 118/723 IR, 723 AN; 156/345.48, 345.49; 315/111.51
See application file for complete search history.

(56) References Cited

U.S. PATENT DOCUMENTS

| | | | |
|---|---|---|---|
| 5,540,824 A | 7/1996 | Yin et al. | |
| 5,572,170 A | 11/1996 | Collins et al. | |
| 5,574,410 A | 11/1996 | Collins et al. | |
| 5,650,032 A * | 7/1997 | Keller et al. | 156/345.48 |
| 5,683,539 A | 11/1997 | Qian et al. | |
| 6,254,746 B1 | 7/2001 | Subramani et al. | |
| 6,297,468 B1 | 10/2001 | Qian et al. | |
| 6,375,810 B2 | 4/2002 | Hong | |
| 6,462,481 B1 | 10/2002 | Holland et al. | |
| 6,465,051 B1 | 10/2002 | Sahin et al. | |
| 6,500,315 B1 * | 12/2002 | Arunachalam et al. | 204/192.12 |
| 6,506,287 B1 | 1/2003 | Ding | |
| 6,508,198 B1 | 1/2003 | Hoffman et al. | |
| 6,518,190 B1 | 2/2003 | Lill et al. | |
| 6,660,134 B1 * | 12/2003 | Gopalraja et al. | 204/192.12 |
| 6,685,798 B1 | 2/2004 | Holland et al. | |
| 6,694,915 B1 | 2/2004 | Holland et al. | |
| 6,695,954 B2 | 2/2004 | Hong | |
| 6,783,639 B2 | 8/2004 | Nulman et al. | |
| 7,098,599 B2 * | 8/2006 | Miyake et al. | 315/111.21 |
| 2004/0083971 A1 | 5/2004 | Holland et al. | |
| 2004/0216676 A1 * | 11/2004 | Wilcoxson et al. | 118/723 I |
| 2005/0224182 A1 * | 10/2005 | Edamura et al. | 156/345.48 |
| 2006/0260937 A1 | 11/2006 | Miller et al. | |

FOREIGN PATENT DOCUMENTS

WO    WO 2004/079764    *    9/2004

* cited by examiner

*Primary Examiner* — Luz L. Alejandro
(74) *Attorney, Agent, or Firm* — Ashok K. Janah; Janah & Associates, P.C.

(57) ABSTRACT

An antenna for coupling RF energy to a plasma in a process chamber having a wall comprises a coil having a face exposed to the plasma in the chamber. A plurality of standoffs support the coil at a set spacing from the wall of the process chamber, at least one standoff comprising a terminal thorough which electrical power is applied to the coil from an external power source. The terminal comprises a conductor receptacle having a first length $L_1$ and a jacket around the conductor receptacle, the jacket having a second length $L_2$. The length $L_1$ is larger than the length $L_2$. A conductor cup is provided about the standoff having the terminal.

17 Claims, 7 Drawing Sheets

INTERIOR ANTENNA FOR SUBSTRATE PROCESSING CHAMBER

BACKGROUND

Embodiments of the present invention relate to an interior antenna for a substrate processing chamber.

In the processing of substrates, such as semiconductor substrates and displays, a substrate is placed in a substrate processing chamber and exposed to an energized gas to deposit or etch material on the substrate. A typical process chamber comprises an enclosure wall that encloses a process zone about a substrate support, a gas supply to provide a process gas composition in the chamber, a gas energizer to energize the process gas to process the substrate, and a gas exhaust port. Such chambers can be used for chemical vapor deposition (CVD), physical vapor deposition (PVD) and etch processes.

In PVD processes, a sputtering target in the chamber faces the substrate. Process gas introduced into the chamber and ionized to form a plasma that sputters material from the target. The process gas can be energized by coupling a high frequency electric field to the gas by, for example, capacitive coupling, inductive coupling, microwave heating or combinations thereof. In a capacitively coupled plasma a voltage is applied across the target and substrate support to couple energy to the process gas. In an inductively coupled plasma (ICP) generator, a current is passed through an antenna to induce electromagnetic currents in the plasma.

An interior antenna can also be positioned inside the chamber and around the plasma generation area between the target and the substrate support. The proximity of the interior antenna to the plasma maximizes the energy being coupled to the plasma. The antenna can also be made of the same material as the target so that its surface is sputtered to provide sputtered material which deposits on the peripheral region of the substrate to equalize sputter deposition rates at the peripheral regions of the substrate to those obtained at the central substrate regions. An annular antenna can also serve to "collimate" the plasma energy to provide better filling of high aspect ratio contact holes in the substrate without forming voids in the holes from the accumulation of sputtered material at the edges of the holes.

However, the sputtered target material also deposits on the exposed surfaces of the interior annular antenna and such accumulated deposits can cause the antenna to deform and bend. Antenna deformation may also arise from thermal expansion in the elevated plasma temperatures. Such deformation can cause the antenna to electrical short when expanded portions of the antenna touch surrounding grounded conductors. Antenna deformation also makes it difficult to reinsert and bolt an antenna in the chamber after the accumulated deposited material is cleaned off the antenna. The entire antenna can also change dimensions to become asymmetrically elliptical from the originally circular geometry or have a wider spacing about its termination points, and consequently, to no longer fit the electrical connections posts used to support the antenna.

Accordingly, it is desirable to have an antenna that provides good energy transfer to a plasma in a process chamber. It is also desirable to have an antenna capable of receiving accumulated deposits without excessive deformation.

SUMMARY

In one version, an interior antenna for coupling RF energy to a plasma in a process chamber having a wall, comprises a coil having a face exposed to the plasma in the chamber. A plurality of standoffs support the coil at a set spacing from the wall of the process chamber, at least one standoff comprising a terminal thorough which electrical power is applied to the coil from an external power source. The terminal comprises a conductor receptacle having a first length $L_1$ and a jacket around the conductor receptacle, the jacket having a second length $L_2$. The length $L_1$ is larger than the length $L_2$. A conductor cup is provided about the standoff having the terminal.

In another version, the interior antenna comprises the coil and a plurality of standoffs to support the coil at a spacing from the wall of the process chamber, at least one standoff comprising a terminal thorough which electrical power is applied to the coil from an external power source, the terminal comprising a conductor receptacle. A conductor cup is around at least one standoff having a terminal, the conductor cup comprising a sidewall having an inner diameter that is sufficiently large to provide a sidewall gap between the sidewall and the terminal such that a change in dimension of the terminal does not result in contact between the terminal and the conductor cup.

In a further version, the interior antenna comprises the coil and a plurality of standoffs that are less than 50 degrees apart, the standoffs supporting the coil to provide a spacing from the wall of the process chamber. A standoff terminal is provided thorough which electrical power is applied to the coil from an external power source.

In yet another version, the antenna comprises the coil and a plurality of standoffs, at least one standoff comprising a terminal thorough which electrical power is applied to the coil from an external power source, the terminal having a outer surface. A conductor cup comprising a inner surface encircles the standoff having a terminal. At least one of the outer surface of the terminal or the inner surface of the conductor cup comprises a ceramic.

Another version of the interior antenna comprises a coil and a plurality of standoffs to support the coil at a spacing from the wall of the process chamber. At least one standoff comprises a terminal having a contact hole with a slidable inner surface adapted to fit an external electrical connector thorough which electrical power is applied to the coil from an external power source.

A further version of the interior antenna comprises a coil comprising a substantially circular section and a radially inwardly bent section. A plurality of standoffs are provided to support the coil at a spacing from the wall of the process chamber.

Another version of the interior antenna comprises a coil having a first section with a first thickness and a second section with a second thickness that is larger than the first thickness.

Yet another version of the interior antenna comprises a coil having a plurality of sections that form a polyhedron about a central axis of the coil; and A process for cleaning a plasma exposed surface of an antenna that is used to couple RF energy to a plasma in a process chamber is also described. The process comprises maintaining an inert gas at a pressure in the process chamber and applying RF power to the inert gas to form a plasma from the gas, the RF power being applied at a power level of at least about 1 kWatts and for a time period of at least about 5 minutes, whereby process deposits on the plasma exposed surface of the coil.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1:
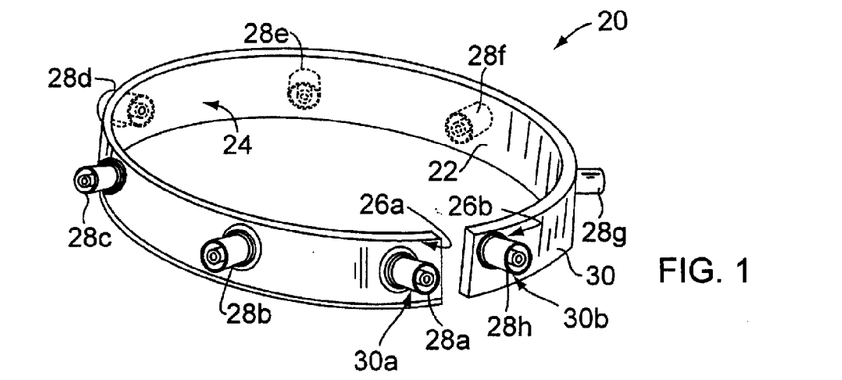
FIG. 1 is a perspective view of an embodiment of an interior antenna for coupling energy to a plasma inside a process chamber.
Figure 2:
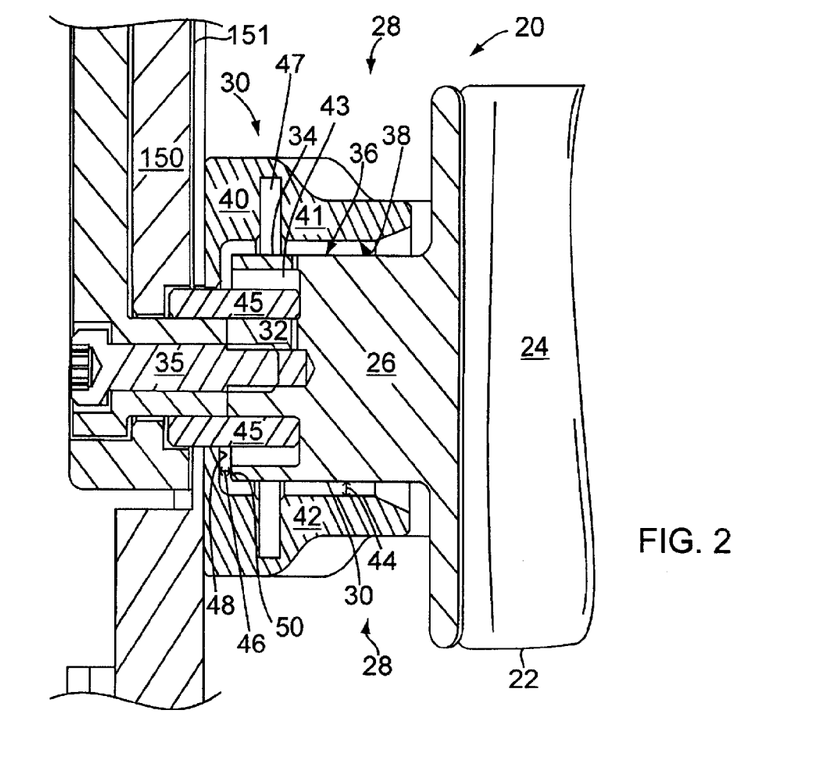
FIG. 2 is a sectional side view of the antenna of FIG. 1 showing a section of the coil and a standoff that includes a terminal for connecting the coil to a connector from an external power supply.
Figure 3:
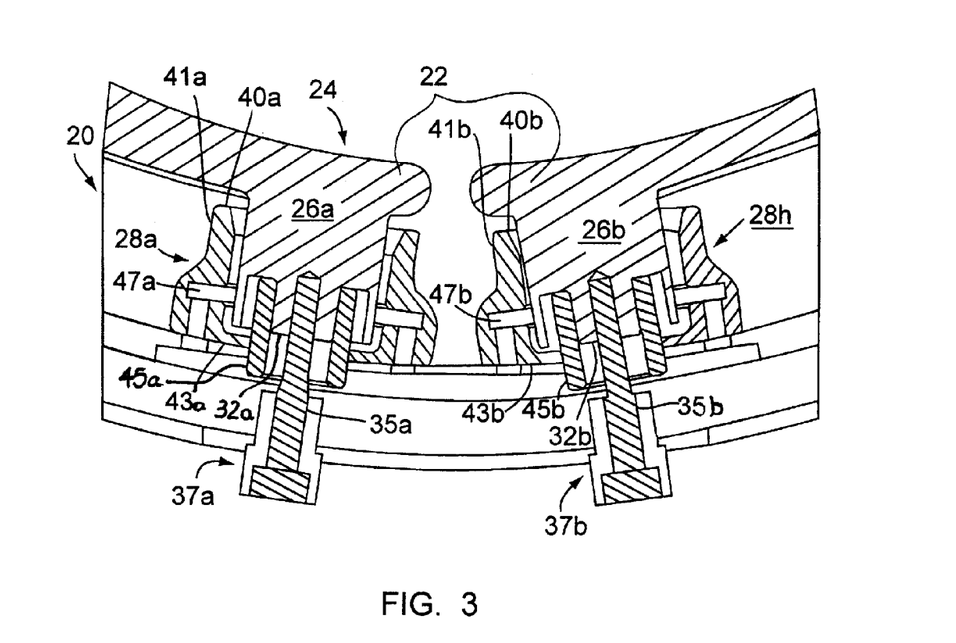
FIG. 3 is sectional top view of the antenna of FIG. 1 showing a pair of standoffs with terminals.

An exemplary embodiment of an interior antenna 20 for coupling energy to a plasma is shown in FIGS. 1 to 3. Generally, the antenna 20 comprises a coil 22 having a face 24 that is exposed to the plasma and about a periphery of a substrate inside a chamber. The face 24 of the coil 22 can be composed of sputterable material, for example, the same material as a sputtering target facing the substrate in a sputtering chamber application. In a sputtering application, sputtered material generated from the face 24 of the coil 22 deposits mostly on the peripheral region of the substrate to balance the thicker deposits formed in the central region of the substrate from the target in the chamber. Thus, sputtered material from antenna 20 counteracts the tendency of target sputtered material to be deposited thicker in the central region of the substrate. In such application, at least the face 24, and more typically, the entire coil 22 is made from a sputterable conducting metal or metal compound, such as one or more of tantalum, tantalum nitride, aluminum, aluminum nitride, titanium, titanium nitride, tungsten, tungsten nitride and copper. For example, in the sputter deposition of tantalum or tantalum nitride, the coil 22 can be made from 99.999% pure tantalum.

Figure 8:
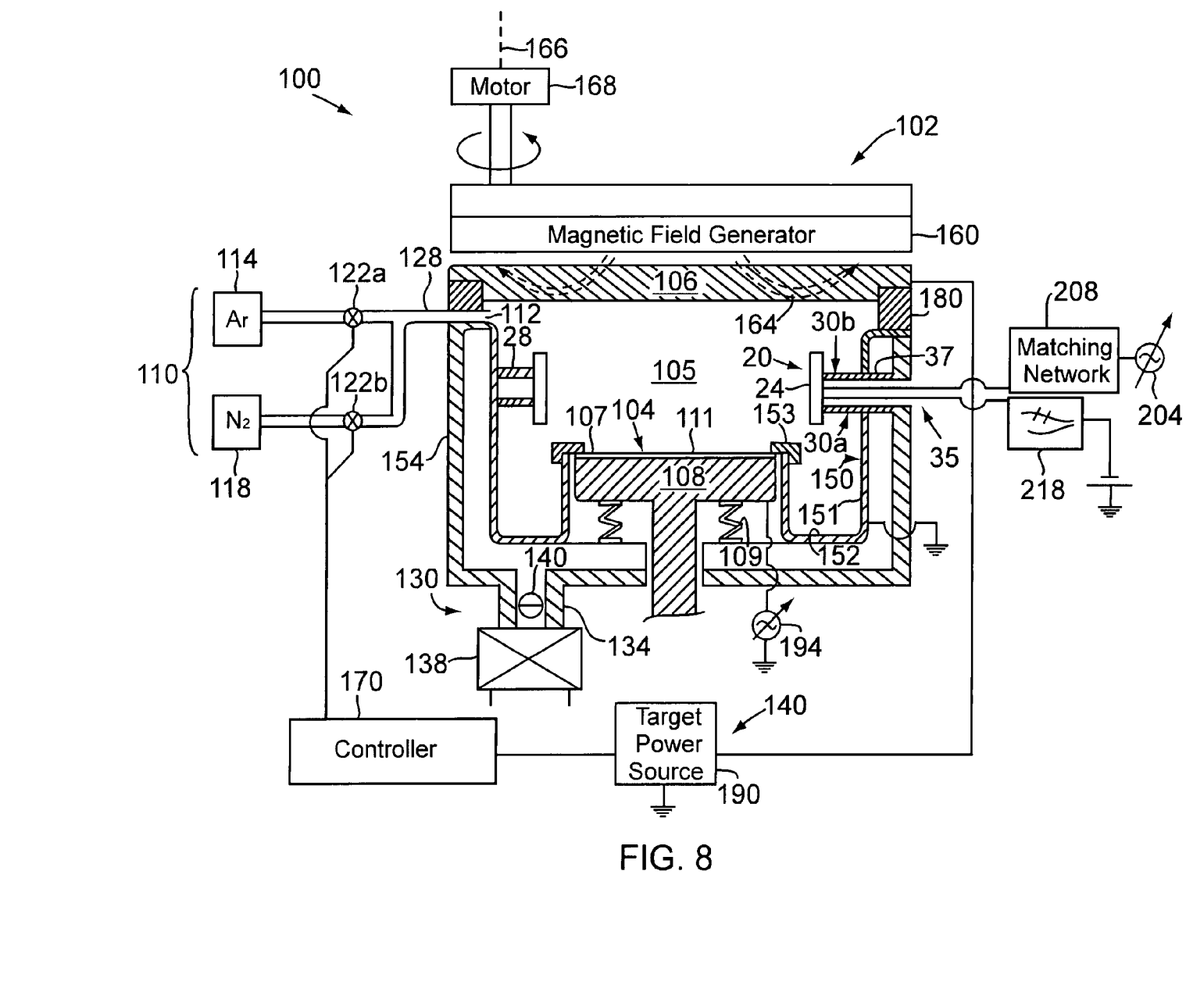
FIG. 8 is a schematic sectional side view of an embodiment of a substrate process apparatus.

In the version shown in FIG. 1, the face 24 of the coil 22 is annular and substantially flat. The coil 22 is typically substantially perpendicular to the plane of the substrate that is within the inner circumference of the coil 22, for example as shown in FIG. 8. However, the face 24 could be slightly angled to the substrate plane or even parallel to the substrate plane. Further, in the exemplary version described herein, the coil 22 is annular or ring-shaped, because it surrounds a substrate such as a semiconductor wafer which is also circular. However, it should be understood that the coil 22 can have other shapes, for example, a rectangular shape to match the shape of the substrate, such as a rectangular display used as a plasma or LCD screen. Thus, the exemplary version of the coil 22 described herein should not be used to limit the scope of the claims.

The coil 22 has at least a pair of terminus 26a,b through which electrical power is applied to the coil 22. The terminus 26a,b are at the beginning and end of a single turn coil 22 as shown; however, an embodiment of coil 22 having multiple turns can have multiple terminus (not shown) to supply current to individual coils.

A plurality of standoffs 28a-h are used to support the coil 22 at a set spacing from a wall of a process chamber as shown in FIG. 8. The standoffs 28a-h electrically insulate the coil 22 from the chamber walls. The standoffs 28a-h also have an internal maze structure which allows deposition of materials from the target in the chamber onto the standoffs 28a-h while preventing the formation of a complete conducting path of deposited material from the coil 22 to the surrounding chamber walls or shield that are typically at electrical ground, which would short the coil. The standoff spacing is set to separate the coil 22 from the wall so that the coil 22 and also brings the coil 22 closer to the plasma zone in the chamber to more efficiently couple energy to the plasma. A suitable spacing is at least about 10 mm, and more typically from about 20 to about 40 mm.

The standoffs 28a-h are spaced apart along the outer circumference of the coil 22 to provide adequate support for the coil. In one version, it is been found that it is desirable to space apart the standoffs 28a-h around the circumference of the coil 22 by less than 50°, for example, by providing at least seven, or even eight standoffs around the coil 22. This configuration renders the coil 22 more rigidly attached to the chamber wall, thereby reducing deformation of the coil 22 during its use in the chamber. Conventional coils that used five or fewer standoffs were found to significantly change in contour when processed deposits accumulate on the face 24 of the coil 22. Thermal stresses arising from the plasma temperatures that the coil 22 is exposed to during processing can also cause deformation of the coil 22. A coil 22 with standoffs 28a-h that are spaced apart by less than 50° ensures that the coil 22 will retain its shape even with the application of deformation stresses. However, in other coil designs, which are strengthened by other means, fewer numbers of standoffs 28 can also be used.

At least one of the standoffs 28a-h comprise a terminal 30a,b thorough which electrical power is applied to the coil 22 from an external power source. For example, the standoffs 28a and 28h can serve as a terminals 30a,b for supplying power to the single turn coil 22 as shown in FIG. 3. The standoffs 28a,b are connected to the two terminus 26a, 26b of the ends of the single turn coil 22 to supply electrical power to the coil 22. The terminals 30a,b each comprise a conductor receptacle 32a,b extending out of a terminus 26a,b of the coil 22. The conductor receptacle 32a,b receives a connector 35a,b of a vacuum feedthrough 37a,b that extends through a shield 150 and/or chamber wall, as shown in FIG. 8, to provide a high frequency current from a power source located outside the chamber. The connectors 35a,b comprise metal pins made from stainless steel, copper or aluminum. The vacuum feedthroughs 37a,b comprises a conventional vacuum seal and can extend directly out of the chamber sidewall (as shown) or from the bottom of the chamber 102.

Each standoff 28a,b with a terminal 30a,b has a surrounding conductor cup 40a,b that covers and shields the terminals 30a,b respectively. The conductor cups 40a,b comprise a cylindrically shaped cover 41a,b with an extension 43a,b, and are preferably made of the same material as that being deposited in the chamber. Hence, if the material being deposited comprises tantalum, the conductor cups 40a,b are preferably also made of tantalum. To facilitate adherence of the deposited material it is preferable to treat the surface of the conductor cups 40a,b by bead blasting which will reduce shedding of particles from the deposited material. The extensions 43a,b each rest on a dielectric isolator 45a,b, such as a ceramic bushing, which insulates the conductor cups 40a,b from the terminals 30a,b. Vent holes 47a,b are provided in the conductor cups 40a,b to vent out gas by products from the assembly.

Figures 4, 5:
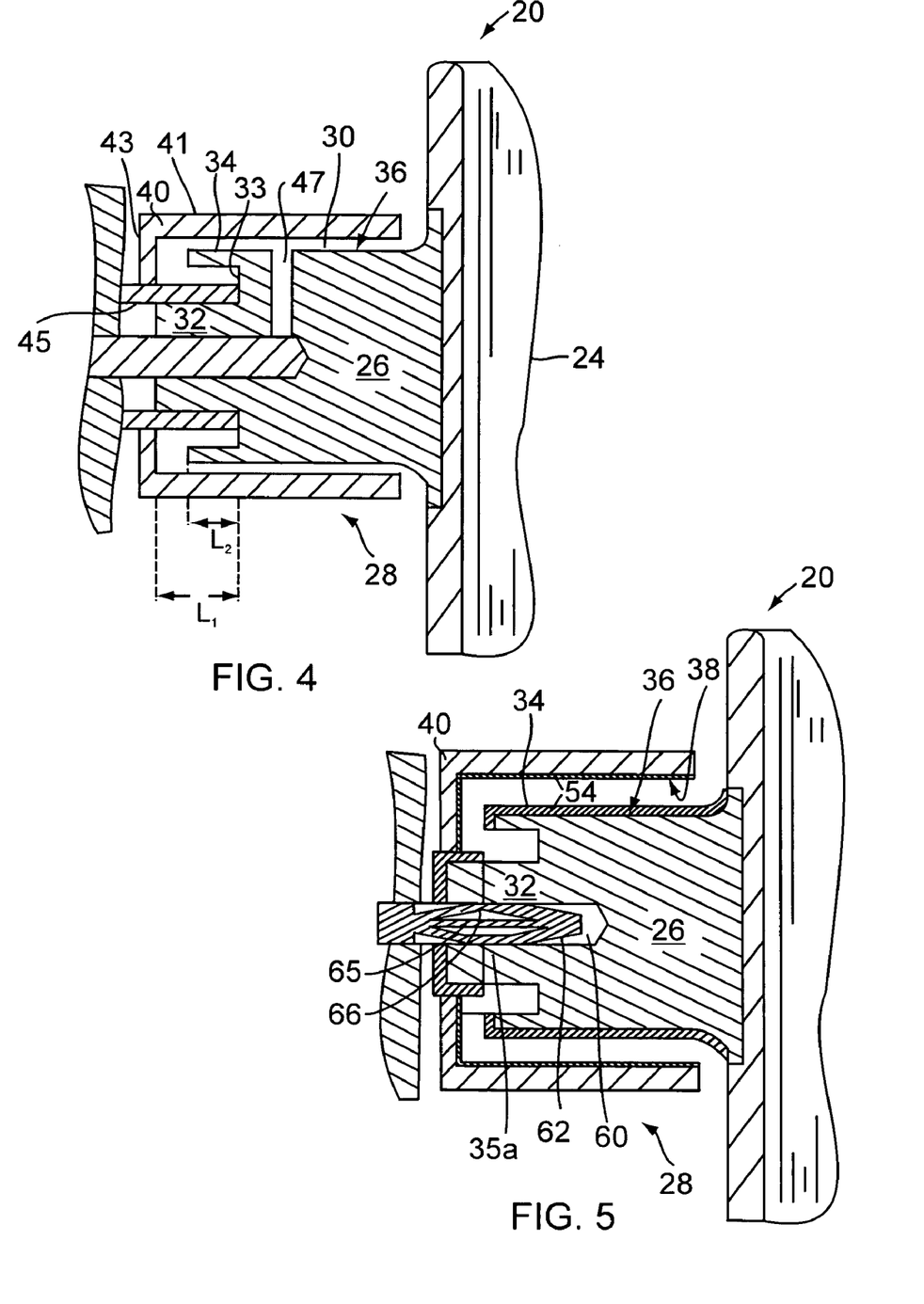
FIG. 4 is a sectional side view of another embodiment of an antenna showing a coil and a standoff with a terminal.
FIG. 5 is a sectional side view of yet another embodiment of an antenna showing a coil and a standoff with a terminal.

A version of the conductor receptacle 32 having a first length $L_1$ and a conducting jacket 34 having a second length $L_2$, as measured from a base 33, is shown in FIG. 4. The conductor receptacle 32 comprises a cylinder and the jacket 34 is a concentric cylinder. In this version, the length $L_2$ is maintained smaller than the length $L_1$ so that expansion or other deformation of the coil 22 does not result in contact between the outer surface 36 of the terminal 30 and the inner surface 38 of a conductor cup 40 which is positioned about the standoff 28. In conventional terminals, contact between the conducting jacket 34 and a conductor cup 40 caused by deformation expansion of the coil 22 was determined to result in electrical shorting of the coil. However, the terminal 30 having a jacket 34 with the reduced length $L_2$ was found to be more robust and resistant electrical shorts. In one version, the second length $L_2$ of the jacket 34 is smaller than the first length $L_1$ of the conductor receptacle 32 by at least about 0.5 mm. The lengths of the conductor receptacle 32 and jacket 34 can be adjusted so that the length $L_2$ is smaller than the length $L_1$ by from about 0.5 mm to about 2.5 mm. In one version, the second length $L_2$ is from about 6 mm to about 10 mm, and the first length $L_1$ is from about 7 mm to about 12 mm.

In another version as shown in FIG. 2, the conductor cup 40 comprises a sidewall 42 having an inner diameter that is sufficiently large to provide a sidewall gap 44 between the sidewall 42 and the jacket 34 such that a change in dimension of the terminal 30 does not result in contact between the terminal 30 and the conductor cup 40. Again, deformation of the coil 22 can cause contact between the outer surface 36 of the jacket 34 and the inner surface 38 of the conductor cup 40 around the standoff 28 resulting in electrical shorting of the coil 22. For example, the inner diameter of the sidewall 42 can be made at least about 24 mm, and more preferably, from about 25 mm to about 30 mm. In this version, the sidewall gap 44 between the sidewall 42 and the jacket 34 is sized large enough that a predetermined change in dimension of the terminal 30 does not result in contact between the terminal 30 and the conductor cup 40. For example, the sidewall gap 44 can be at least about 2 mm. A vent hole 47 is also provided to allow out gassing of byproducts and contaminants that burn off from the various holes and internal surfaces of the standoff 28.

It may also be necessary to provide a bottom wall gap 46 between a bottom wall 48 of the conductor cup 40 and a circumferential edge 50 of the jacket 34. The bottom wall gap 46 is made sufficiently large that a change in dimension of the terminal 30 does not result in contact between the edge 50 of the terminal 30 and the wall 48 of the conductor cup 40. For example, the bottom wall gap 46 can be is at least about 1 mm, and more typically, from about 1.2 mm to about 2 mm. In this version, the bottom wall 48 between the conductor cup 40 is sized thinner or the jacket 34 is sized smaller to provide a gap size that allows the terminal 30 to change in dimension within the bottom wall gap 46 without contact between the terminal 30 and the conductor cup 40. The bottom wall gap is formed by maintaining the bottom wall 48 at a depth from the inside circumferential edge 50 that is sufficiently large that a change in dimension of the terminal does not result in contact between the terminal 30 and the conductor cup 40. For example, the depth of the bottom wall 48 can be at least about 15 mm, or even from about 15 mm to about 20 mm.

In yet another version, at least one of an outer surface 36 of the terminal 30 of a standoff 28 or an inner surface 38 of a conductor cup 40 is coated with a ceramic 54, as shown in FIG. 5. The terminal 30 comprises an outer surface 36 about the jacket 34. The conductor cup 40 comprises an inner surface 38 encircling the terminal 30. When conventional coils deform, a stress is applied to the terminal 30 which causes the terminal to expand or deform resulting in touching of the outer surface 36 of the terminal 30 with the inner surface 38 of the conductor cup 40 and resultant electrical shorting. In this version, either of the outer surface 36 of the terminal 30 or the inner surface 38 of the conductor cup 40 comprises a ceramic 54. Suitable ceramics include aluminum oxide, silicon oxide, titanium oxide, zirconium oxide, glass ceramics and mixtures thereof. The ceramic 54 can be provided in a thickness of less than about 1 mm, and more preferably from about 0.05 mm to about 0.5 mm. A suitable ceramic comprises a ceramic casing that covers the surfaces 36, 38 and is made by machining a block of a polycrystalline ceramic or glass ceramic. The ceramic 54 can be in the form of a coating applied to the surfaces 36, 38, or a machined casing that covers the surfaces 36,38. Suitable ceramic coating methods include plasma spraying, or slurry coating and sintering The ceramic coating can have a thickness of less than about 0.05 mm.

In a further version, the terminal 30 comprises a contact hole 60 with a inner sliding surface 62 adapted to fit an external sliding connector 35a thorough which electrical power is applied to the coil 22, also shown in FIG. 5. For example, the contact hole 60 of the terminal 30 can be shaped to have an inner diameter sized to receive a sliding connector 35a a banana plug 65, as shown. Other sliding connectors such as the ½ inch or 3.5 mm connectors used in stereo equipment or types using a spring design can also be used. The sliding connector 35a can be made from a conducting metal, and more preferably is made form a metal which has a spring-like resilience, for example, phosphorous bronze. The banana plug 65 has longitudinal arms 66 which extend outwardly from a base at an angle, which upon reaching a maxima at a midsection, flexes inward at a second angle. The banana plug 65 flexes and partially collapses to apply an outward pressure against the inner sliding surface 62 when inserted into the contact hole 60. The contact hole 60 has a diameter slightly smaller than the outer diameter of the midsection of the banana plug 65.

Figure 6A:
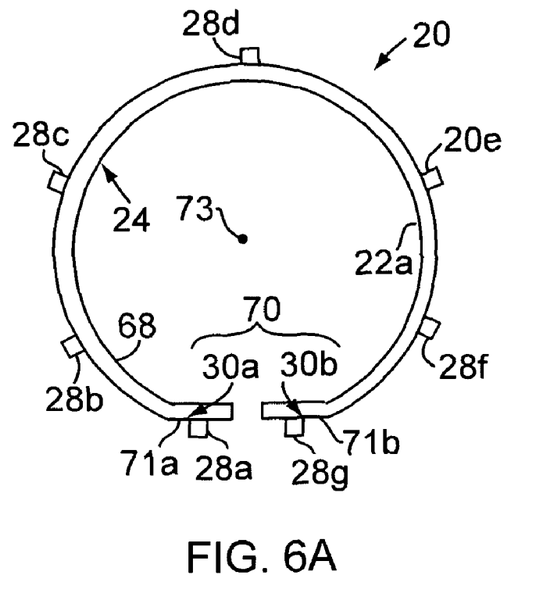
FIG. 6A is a schematic top view of another embodiment of an antenna having a coil and standoffs.

In another version, the coil 22a is modified to allow it to better absorb stresses as shown in FIGS. 6A to 6D. For example, as shown in FIG. 6A, the coil 22a can be shaped to have different sections that include a substantially circular section 68 and a radially inwardly bent section 70. As shown, the radially inwardly bent section 70 comprises first and second parts 71a,b that each have thereon a standoff 28a,g. The substantially circular section 68 extends across the remaining circumference of the coil 22a having the other standoffs 28b-f. The radially inwardly bent section 70 of the coil 22 is provided at the location of standoffs 28a,g which include the terminals 30a,b because these standoffs 28a,g create different stresses than the other standoffs 28b-f which are positioned about the circular section 68 and do not serve as terminals. The radially inwardly bent section 70 is shown as a split section, which has first and second parts 71a,b that abut one another, have a gap therebetween, and can also be substantially in the same plane. In another embodiment, the coil can also have a single continuous part without a split (not shown). The face 24a of the coil 22a that is exposed to the plasma is still substantially circular to provide a uniform electric field about the substrate. The radially inwardly bent sections 70 can also be located about each one of the standoffs 28a-g.

Figure 6B:
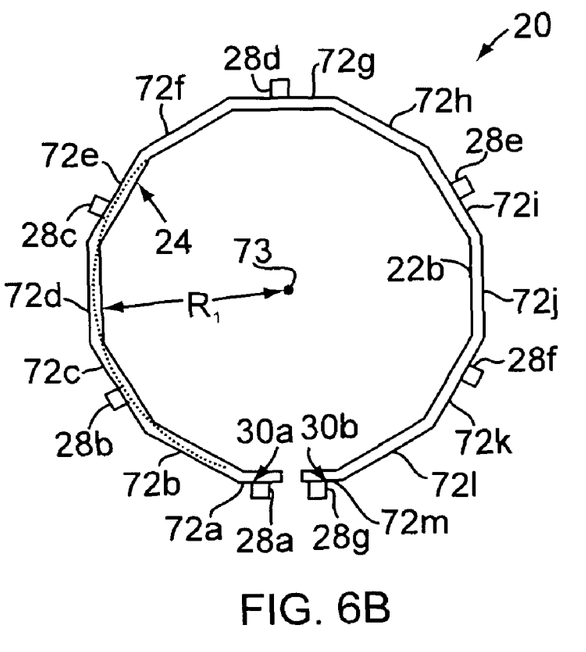
FIG. 6B is a schematic top view of another embodiment of an antenna having a coil and standoffs.

In another version, the coil 22b has a plurality of angular sections 72a-k that form a polyhedron about a central axis 73 of the coil 22c as shown in FIG. 6B. Each angular section 72a-k is radially inwardly bent, so that the coil 22b has a plurality of radially inwardly bent sections 72a-k. The sections 72a-k are at an average radius $R_1$, from the center 76 of the coil. The radius $R_1$, is typically from about 120 mm to about 200 mm. Each section can also deviate from $R_1$ by up to 10 mm. The sections 72a-k can be substantially planar, circular, or alternately planar and circular. For example, the alternate skipped sections 72a,c,e,g,i,k,m can be planar and positioned at the standoffs 28a-g to provide greater rigidity at these locations, while the sections 72b,d,f,h,j,l are circular and located between the planar sections.

Figure 6C:
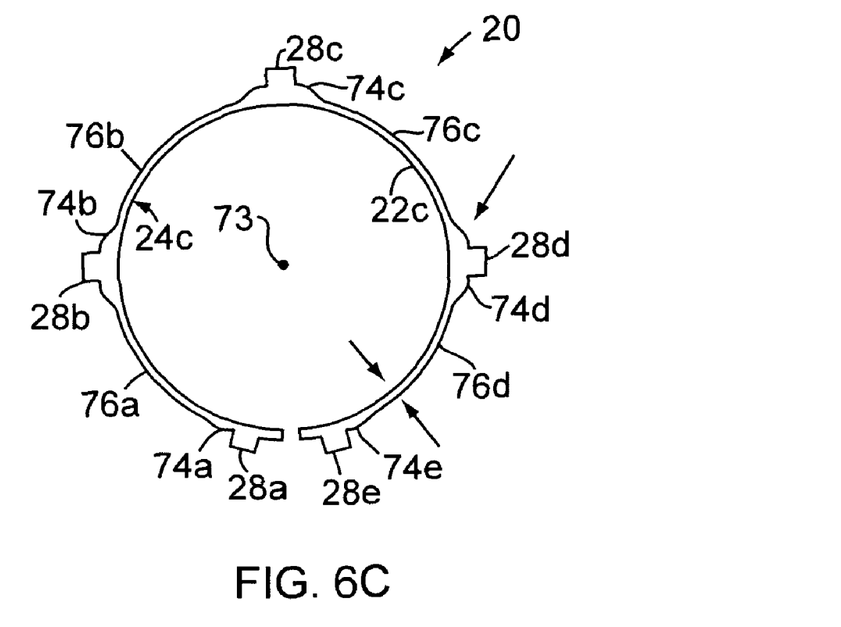
FIG. 6C is schematic top view of another embodiment of an antenna having a coil and standoffs.

In a further version, the coil 22c is shaped to have first sections 74a-e with a first thickness and a second sections 76a-d having a second thickness, as shown in FIG. 6C. In the version shown, the first thickness is larger than the second thickness. For example, the first thickness can be larger than the second thickness by a factor of at least about 1.5. As an example, the first thickness can be from about 16 to about 20 mm and the second thickness can be from about 14 to about 18 mm. The thicker sections 74a-e can be located at the standoffs 28a-e to provide greater rigidity at these locations, while the thinner sections 76a-d are located in between the thick sections to provide suitable flexing of the coil. However, alternative versions can have different sections with different thickness that are selected depending upon the deformation stresses that occur at that particular section during use of the coil 22c, can also be used. The face 24c, which is exposed to the plasma, is still at the same distance away from the center 73 because the thicker portions extend outwardly from the external surface of the coil 22c.

Figure 6D:
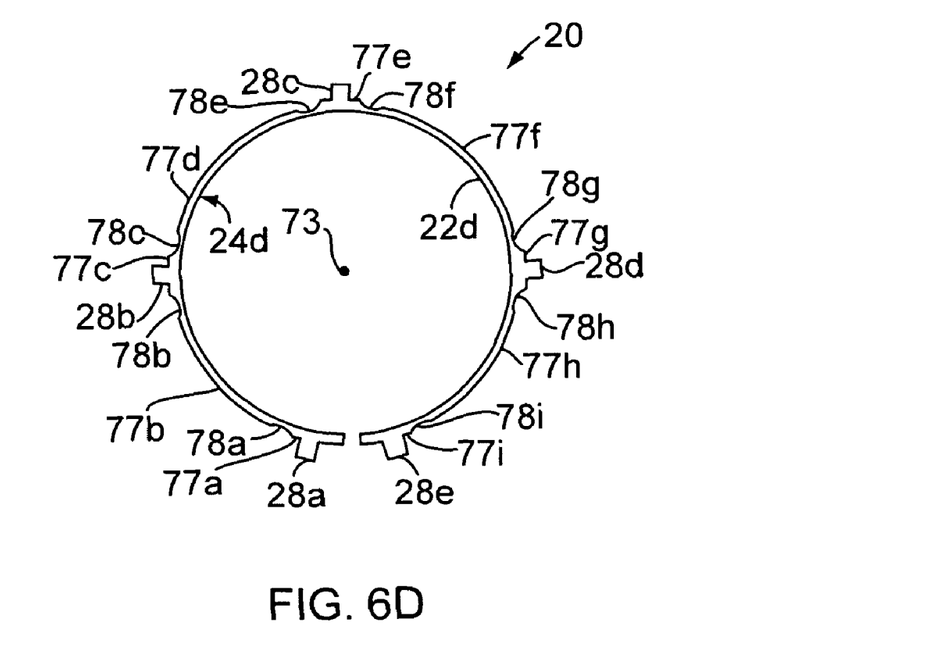
FIG. 6D is schematic top view of another embodiment of an antenna having a coil and standoffs.

In yet another version, the coil 22d is shaped to have first sections 77a-i having a substantially uniform first thickness and a second sections 78a-i having a average second thickness across a curved region, as shown in FIG. 6D. In the version shown, the first thickness is larger than the average second thickness. For example, the first thickness can be larger than the average second thickness by the same factor as previously described. The first sections 77a-i provide rigidity for supporting the standoffs 28a-e while the second sections 78a-i are curved inward and serve as hinges allowing flexing of the first sections 77a-i which have the load bearing standoffs 28a-e. In yet another version, the sections 77 which are located at the positions of the standoffs 28a-e can be made thicker to provide greater rigidity at these locations than the sections 78 b which are in between the thicker sections.

Figure 7A:
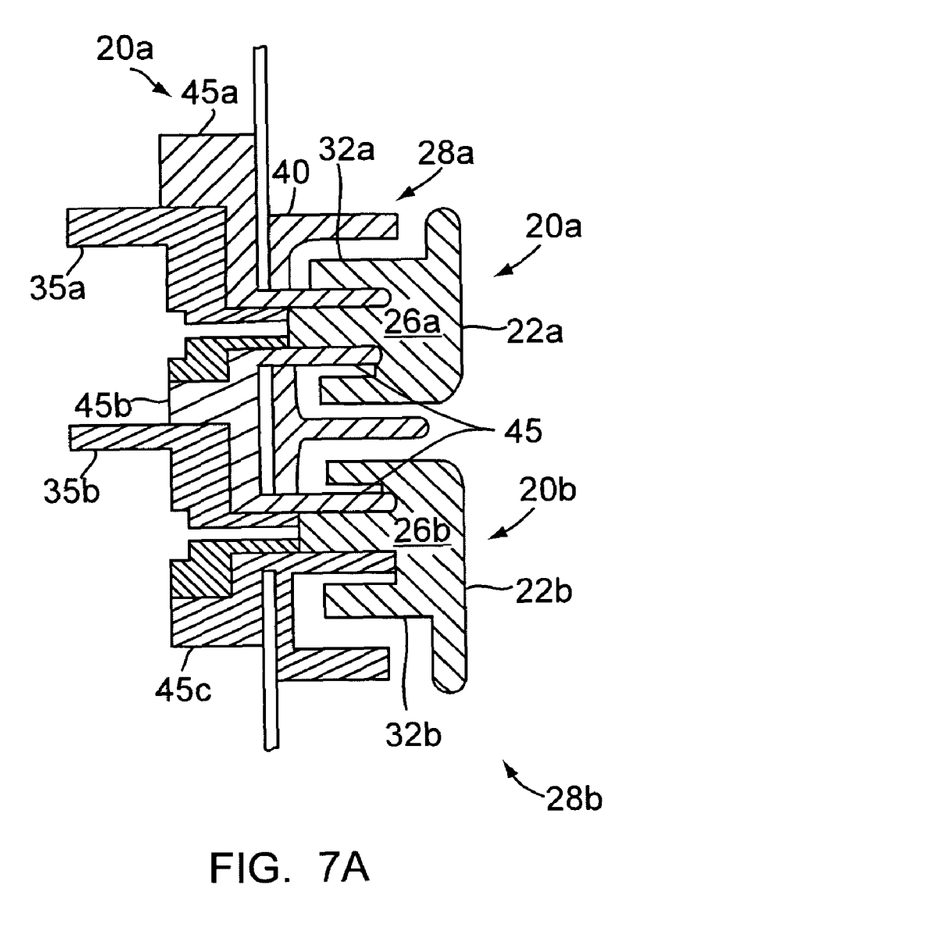
FIG. 7A is schematic sectional side view of an embodiment of an antenna having stacked coils.
Figure 7B:
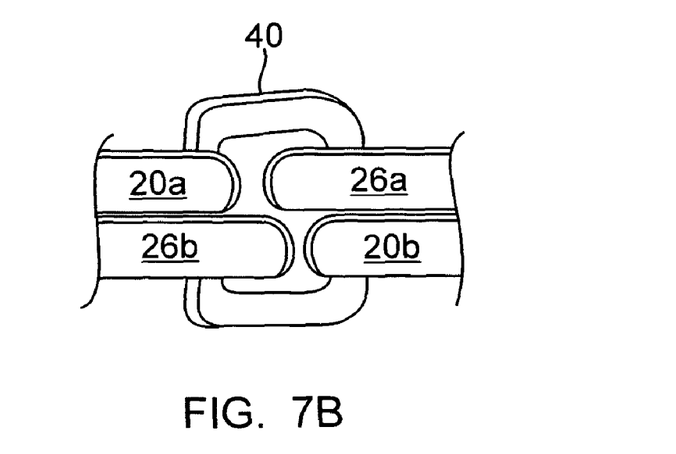
FIG. 7B is a perspective view of the antenna of FIG. 7A showing the coil terminus having interlocking edges.

FIGS. 7A and 7B show another version of an antenna 20a, which has two single, turn coils 22a,b stacked on top of one another. A plurality of standoffs 28a,b are used to support the coils 22a,b at a set spacing from a wall of a process chamber. The upper coil 22a has an exposed face 22a, which is located above the exposed face 22b of the coil 22b. Each coil 22a,b has a terminus portion 26a,b respectively. For example, the terminus 26a for coil 22a can connect to or more terminals 30a, and the terminus 26b for coil 22b can connect to one or more terminals 30b as shown in FIG. 7A. The terminals 30a,b each comprise a conductor receptacle 32a,b extending out of the terminus 26a,b of the coils 22a,b. The conductor receptacles 32a,b receives connectors 35a,b that are connected to the external environment. If the upper and lower coils 22a,b are joined together, that is current flows from one to the other, only a single pair of terminals 30a,b is needed for both coils 22a,b (or coil turns) otherwise two pairs of terminals are needed with each pair of terminals being used for a single coil. The coils 22a,b can also have interlocking edges 80a,b at their terminus 26a,b, as shown in FIG. 7B, to allow the terminals 30a,b to be located above each other to allow a single conductor cup 40 to enclose both terminals 30a,b as shown. Various dielectric isolators 45a-c are used to electrically separate and isolate the conductors and connectors of the terminals 30a,b. In yet another version, a multiple turn coil can also have individual coil segments that tap current from one another in a parallel or series arrangement (not shown) instead of having separate terminals for each coil as shown.

The above-described versions of the antenna 20 can be mounted in any suitable substrate processing apparatus comprising a process chamber. An exemplary embodiment of a substrate processing apparatus 100 comprising a process chamber 102 for processing a substrate 104 is shown in FIG. 8. The chamber 102 has a sputtering target 106, which is sputtered by a plasma formed in a plasma zone 105 to sputter deposit a layer on the substrate 104. The target 106 can be made of a conducting metal or metal compound, such as one or more of tantalum, tantalum nitride, aluminum, aluminum nitride, titanium, titanium nitride, tungsten, tungsten nitride and copper.

A substrate support 108 is provided for supporting the substrate 104 in the chamber 102. The substrate support 108 can also include cooling and heating systems. A flexible sealing bellow 109 is used to move the support 108 vertically within chamber 102 while the interior of chamber remains gas tight from the external environment. The substrate 104 is introduced into the chamber 102 through a substrate-loading inlet (not shown) of the chamber 102 and placed on the support 108. The support 108 can include a mechanical, vacuum or electrostatic chuck to hold the substrate.

A gas supply 110 introduces a gas into the chamber 102 through a gas inlet 112 that is connected to one or more gas sources 114, 118, respectively. One or more mass flow controllers 122a,b are used to control the flow rate of the individual gases, which may be premixed in a mixing manifold 128 prior to their introduction into the chamber 102 or which may be separately introduced into the chamber 102. The gas typically includes a non-reactive gas, such as argon or xenon, that when ionized to form a plasma, energetically impinges upon and bombards the target 106 to sputter material, off from the target 106. The gas may also comprise a reactive gas, such as nitrogen. For example, to deposit TaN, a target of tantalum is used together with nitrogen flowed into the chamber 102. Also, other compositions of gas that include other reactive gases or other types of non-reactive gases may be used as would be apparent to one of ordinary skill in the art.

An exhaust system 130 controls the pressure of the sputtering gas in the chamber 102 and exhausts excess gas and by-product gases from the chamber 102. The exhaust system 130 comprises an exhaust port 132 in the chamber 102 that is connected to an exhaust line 134 that leads to one or more exhaust pumps 138. A throttle valve 140 in the exhaust line 134 may be used to control the pressure of the sputtering gas in the chamber 102. Typically, the pressure of the sputtering gas in the chamber 102 is set to sub-atmospheric levels.

The sputtering chamber 102 may also have a shield 150, which is in front of the sidewall 154 of the chamber 102 to receive sputtering deposits, and thereby prevent their deposition and accumulation on the wall 112. The shield 150 can also be electrically grounded to serve as grounding plane. The shield 150 is generally bowl-shaped and includes a generally cylindrically shaped, vertically oriented wall 151 to which the standoffs 128 are attached to insulatively support the coil 22. The shield 150 further has a generally annular-shaped floor wall 152, which surrounds the substrate support 108, which supports the substrate 104. A clamp ring 153 clamps the substrate to the support 108 and covers the gap between the floor wall 152 of the shield 150 and the support 108. The shield 150 together with the clamp ring 153 protects the interior of the chamber 102 from the deposition materials that is deposited on the substrate 104 in the chamber 102. The antenna 20 is attached to the shield 150 by the standoffs 28, at least some of the standoffs also including one or more of the terminals 30a,b.

The chamber 102 can also have a magnetic field generator 160 that generates a magnetic field 164 near the target 106 to increase an ion density in the plasma zone 105 adjacent to and below to the target 106 to improve sputtering of the target. One embodiment of a magnetic field source 160 which provides sustained self-sputtering of copper or sputtering of aluminum, titanium, or other metals; while minimizing the need for non-reactive gases is, for example, described in U.S. Pat. No. 6,183,614 to Fu, entitled "Rotating Sputter Magnetron Assembly"; and U.S. Pat. No. 6,274,008 to Gopalraja et al., entitled "Integrated Process for Copper Via Filling," both of which are incorporated herein by reference in their entirety. In one version, the magnetic field source 160 generates a semi-toroidal magnetic field 164 about the target 106. In another version, the magnetic field source 160 comprises a motor 168 to rotate the magnetic field source 160 about a rotation axis 166.

The chamber 102 can be controlled by the chamber controller 170, which comprises program code having instruction sets to operate components of the chamber 102 to process substrates 104 in the chamber 102. For example, the controller 170 can comprise program code that includes a substrate positioning instruction set to operate one or more of the substrate support 108 and substrate transport to position a substrate 104 in the chamber 102; a gas flow control instruction set to operate the sputtering gas supply 110 and mass flow controllers 122a,b; a gas pressure control instruction set to operate the exhaust system 130 and throttle valve 138 to maintain a pressure in the chamber 102; a target power control instruction set to operate the target power source 140 to set a gas energizing power level; a temperature control instruction set to control temperatures in the chamber 102; a process monitoring instruction set to monitor the process in the chamber 102; and a antenna power controlling instruction set to control the AC and/or DC power applied to the coil 22 of the antenna 20.

The sputtering target 106 is electrically isolated from the chamber 102 by the dielectric 180. The target is also biased by a target power source 190, such as a DC or RF power source, with a polarity to attract ions in the plasma. In one version, the target power source 190, target 106, and shield 150 operate as a gas energizer 140 that is capable of energizing the sputtering gas to sputter material from the target 106. The target power source 190 electrically biases the target 106 relative to the shield 150 to energize the sputtering gas in the chamber 102 to form a plasma that sputters material from the target 106. The material sputtered from the target 106 by the plasma is deposited on the substrate 104 and may also react with reactive or other gas components of the plasma to form a deposition layer on the substrate 104.

Typically, the material sputtered from metal target 106 is ionized in the plasma to become positive metal ions. In order to promote deposition of these positive metal ions on the substrate, the substrate support 108 may be connected to a suitable bias voltage source 194 such as an AC power source. In the illustrated embodiment, the power sources 190 and 194 cause a negative bias to develop on the target 106 and the substrate 104, respectively.

Figure 9:
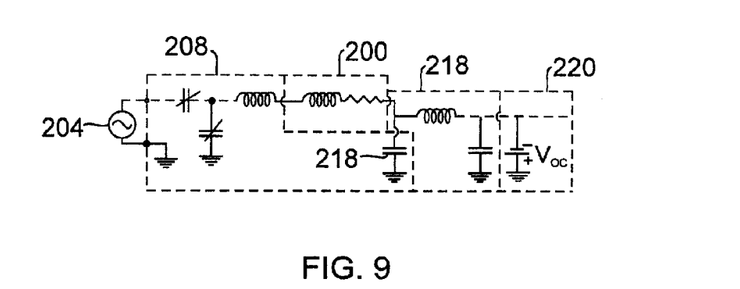
FIG. 9 is an embodiment of an electrical circuit associated with the apparatus of FIG. 8.

High frequency power is supplied to the coil 22 of the antenna 20 from an RF power supply 204 via an appropriate matching network 208, an exemplary version of which is shown in FIG. 9. One terminus of the antenna 20 is connected to matching network 208 and the other terminus of the antenna 20 is connected to ground via an RF filter 218 as shown in FIG. 8. The RF power supplied to antenna 20 results in the generation of an electromagnetic field that further sustains or generates the plasma in the plasma zone 105. The magnetic field generator 160 also contributes to generation of the plasma in the chamber 102. In the absence of RF current to the antenna 20, a plasma of lower density can also be generated in the vicinity of target 106 by applying a DC or RF voltage to target 106. Under these conditions, material to be deposited on a substrate 104 is sputtered from target 106, at least partially ionized in the plasma field and directed onto the substrate 104.

When the only voltage applied to coil 22 is an alternating RF voltage, it is believed that a DC self bias is inherently induced on coil 22 across RF filter 218. In the illustrated embodiment, this bias will have a negative polarity and can be of the order of −100 volts. The coil 22 can also be made of a sputterable material, such as the same material as the target 106, as previously described, so that plasma ions attracted to coil 22 as a result of the DC self bias will sputter or dislodge material from the surface of coil 22. The target 106 and coil 22 provide spatially separated sources of sputter material, which can be used to improve film properties, for example, since coil 22 is positioned immediately outside the periphery of the substrate 104, sputtered material originating from antenna 20 tends to be deposited mostly in the peripheral region 107 of the substrate 104 rather than the center region 111. This is beneficial when operating with higher gas pressures when material sputtered from target 106 tends to be deposited thicker in the central region 111 of the substrate 104 than in the peripheral region 107. Thus, the sputtering of deposition material from antenna 20 can counteract the tendency of material sputtered from target 106 to be deposited thicker in the central region 111 of the substrate 104.

The coil sputtering rate may be controlled with a degree of independence of the power level to obtain the best deposition uniformity. In the illustrated embodiment, energy supplied to the antenna 20 to generate a plasma and a separate DC bias is also applied to the antenna 20 to separately control the coil bias level and hence the coil sputtering rate. The DC bias on antenna 20 can be altered independently of the magnitude and frequency of the power delivered by supply 204 by connecting coil 22 to a DC voltage source 220. The RF filter 218 is connected between coil 22 and DC voltage source 220 to eliminate or reduce substantially RF current flowing to the DC source 220. Filter 218 provides a small DC impedance between source 220 and coil 22 so that the coil 22 is placed at a DC bias essentially equal to the voltage provided by voltage source 220. While voltage source 220 is represented schematically by a battery, it will be appreciated that any suitable DC voltage source can be employed and the output voltage thereof can be adjusted to produce the desired level of DC bias on coil 22.

An exemplary circuit used to supply RF current and a DC bias voltage to the coil 22 is illustrated in FIG. 9. In the circuit, the antenna 20 is represented by its equivalent circuit, which is a series arrangement of an inductance and a resistance. While the RF source 204 and matching network 208 are preferably coupled to a terminus 26a of the coil 22, the DC source 220 and filter 218 may be coupled to the coil 22 anywhere along its length. Matching network 208 is a conventional network, which includes two adjustable capacitors and an inductor. As is known, the purpose of circuit 200 is to match the output impedance of RF power supply 204 to the impedance of the load to which it is connected. In addition, the filter 218 connected between antenna 20 and ground serves to prevent flow of a DC current from antenna 20 to ground. To improve deposited layer uniformity, RF frequency and power levels may be periodically altered during deposition. In addition, impedances of the components of the matching network and RF filter may be periodically varied during deposition. Filter 218 is constructed of capacitors and inductors to block transmission of RF power from coil 22 to DC source 220.

Instead of, or in addition to the various coil and standoff versions illustrated herein, a better chamber cleaning method can also be used to remove at least some of the accumulated deposits on the coil 22. In method, of cleaning the surfaces of the coil 22 that are exposed to the plasma in the chamber, an inert gas is maintained at a pressure in the process chamber and an RF power is applied to the inert gas via the coil and target, for example, to form a plasma from the gas. The plasma cleans off the accumulated deposits from the coil. The RF power is applied at a power level of at least about 1 kW and for a time period of at least about 5 minutes to remove the deposits on the surfaces of the coil. Preferably, the RF power is applied to the inert gas at a power level of from about 1 to about 5 kWatts and for a time period of at least about 10 minutes. In one version, the inert gas comprises argon provided at a flow rate of, for example, 20 sccm.

The present invention has been described with reference to certain preferred versions thereof; however, other versions are possible. For example, the antenna can be used in other types of applications, as would be apparent to one of ordinary skill, for example, etching, CVD and cleaning processed. Other shapes and configurations of the coil can also be used, as can other methods of cleaning the coil, which would be obvious to one of ordinary skill in the art. Therefore, the spirit and scope of the appended claims should not be limited to the description of the preferred versions contained herein.

What is claimed is:

1. An interior antenna for coupling RF energy to a plasma in a process chamber having a wall, the antenna comprising:
   (a) a coil having a face exposed to the plasma in the chamber, the coil comprising a substantially circular section and first and second radially inwardly bent sections that abut one another and have a gap therebetween;
   (b) a plurality of standoffs to support the coil at a spacing from the wall of the process chamber, at least one standoff located on the first and second radially inwardly bent sections of the coil, the at least one standoff comprising a terminal extending out of the coil and through which electrical power is applied to the coil from an external power source, the terminal comprising (i) a conductor receptacle to receive a power connector through which electrical power is applied to the coil, the conductor receptacle having a first length $L_1$; and (ii) a conducting jacket around the conductor receptacle, the conducting jacket having a second length $L_2$ that is smaller than the first length $L_1$;
   (c) a dielectric isolator; and
   (d) a conductor cup about each standoff having the terminal, the conductor cup having extensions that rest on the dielectric isolator.

2. An antenna according to claim 1 wherein $L_2$ is smaller than $L_1$ by at least about 0.5 mm.

3. An antenna according to claim 1 wherein $L_2$ is smaller than $L_1$ by from about 0.5 mm to about 2.5 mm.

4. An antenna according to claim 1 wherein is $L_1$ is from about 7 mm to about 12 mm.

5. An antenna according to claim 1 wherein $L_2$ is from about 6 mm to about 10 mm.

6. An antenna according to claim 1 wherein the conductor cup comprises a sidewall having an inner diameter that is sufficiently large to provide a sidewall gap between the sidewall and the conducting jacket.

7. An antenna according to claim 1 wherein the conductor cup further comprises an inside circumferential edge and a bottom wall at a depth from the inside circumferential edge that is sufficiently large to provide a bottom wall gap between the bottom wall and the terminal.

8. An antenna according to claim 1 wherein $L_2$ is from about 6 mm to about 10 mm.

9. An antenna according to claim 1 wherein the first and second radially inwardly bent sections lie in substantially the same plane.

10. An interior antenna for coupling RF energy to a plasma in a process chamber having a wall, the antenna comprising:
    (a) a coil having a face exposed to the plasma in the chamber, the coil comprising a substantially circular section and first and second radially inwardly bent sections that abut one another and have a gap therebetween;
    (b) a plurality of standoffs to support the coil at a spacing from the wall of the process chamber, at least one standoff located on the first and second radially inwardly bent sections of the coil, the at least one standoff comprising a terminal extending out of the coil and through which electrical power is applied to the coil from an external power source, the terminal comprising (i) a conductor receptacle to receive a power connector through which electrical power is applied to the coil, the conductor receptacle having a first length $L_1$; and (ii) a conducting jacket around the conductor receptacle, the conducting jacket having a second length $L_2$ that is smaller than the first length $L_1$ by at least about 0.5 mm;
    (c) a dielectric isolator; and
    (d) a conductor cup about the standoff having the terminal, the conductor cup having extensions that rest on the dielectric isolator.

11. An antenna according to claim 10 wherein $L_2$ is smaller than $L_1$ by from about 0.5 mm to about 2.5 mm.

12. An antenna according to claim 10 wherein the conductor cup comprises a sidewall having an inner diameter that is sufficiently large to provide a sidewall gap between the sidewall and the conducting jacket.

13. An antenna according to claim 10 wherein the conductor cup further comprises an inside circumferential edge and a bottom wall at a depth from the inside circumferential edge that is sufficiently large to provide a bottom wall gap between the bottom wall and the terminal.

14. An interior antenna for coupling RF energy to a plasma in a process chamber having a wall, the antenna comprising:
    (a) a single turn coil having a face exposed to the plasma in the chamber, the single turn coil comprising a substantially circular section and first and second radially inwardly bent sections that are substantially within a single plane;

(b) a plurality of standoffs to support the coil at a spacing from the wall of the process chamber, at least one standoff located on the first and second radially inwardly bent sections of the coil, the at least one standoff comprising a terminal extending out of the coil and through which electrical power is applied to the coil from an external power source, the terminal comprising (i) a conductor receptacle to receive a power connector through which electrical power is applied to the coil, the conductor receptacle having a first length $L_1$; and (ii) a conducting jacket around the conductor receptacle, the conducting jacket having a second length $L_2$ that is smaller than the first length $L_1$;
(c) a dielectric isolator; and
(d) a conductor cup about the standoff having the terminal, the conductor cup having extensions that rest on the dielectric isolator.

15. An antenna according to claim 14 wherein $L_2$ is smaller than $L_1$ by at least about 0.5 mm.

16. An antenna according to claim 14 wherein the conductor cup comprises a sidewall having an inner diameter that is sufficiently large to provide a sidewall gap between the sidewall and the conducting jacket.

17. An antenna according to claim 14 wherein the conductor cup further comprises an inside circumferential edge and a bottom wall at a depth from the inside circumferential edge that is sufficiently large to provide a bottom wall gap between the bottom wall and the terminal.

* * * * *